United States Patent
Wang et al.

(10) Patent No.: US 10,948,315 B2
(45) Date of Patent: Mar. 16, 2021

(54) MAGNETIC POSITION DETECTING DEVICE AND METHOD

(71) Applicant: Industrial Technology Research Institute, Hsinchu (TW)

(72) Inventors: Yu-Ming Wang, Hsinchu (TW); Chen-Chung Du, Hsinchu (TW); Brian Luan Chen, Hsinchu (TW); Jen-Yuan Chang, Hsinchu (TW); Jwu-Sheng Hu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 41 days.

(21) Appl. No.: 16/229,492

(22) Filed: Dec. 21, 2018

(65) Prior Publication Data
US 2020/0200568 A1    Jun. 25, 2020

(51) Int. Cl.
   *G01D 5/14*   (2006.01)
   *G01R 33/09*  (2006.01)
   *G01D 5/20*   (2006.01)

(52) U.S. Cl.
   CPC .......... *G01D 5/145* (2013.01); *G01D 5/147* (2013.01); *G01D 5/2046* (2013.01); *G01R 33/09* (2013.01)

(58) Field of Classification Search
   CPC .......... G01D 5/145; G01D 5/147; G01D 5/20; G01D 5/2006; G01D 5/202; G01D 5/2026; G01D 5/204; G01D 5/2053; G01D 5/206; G01D 5/2066; G01D 5/22; G01D 5/2208; G01D 5/2225; G01D 5/2233; G01D 5/244; G01D 5/24414; G01D 5/2451; G01D 5/2454; G01D 5/2455; G01D 5/2457; G01D 5/2497; G01R 33/09; G01B 7/14
   See application file for complete search history.

(56) References Cited

U.S. PATENT DOCUMENTS

| | | | |
|---|---|---|---|
| 3,509,469 A |  | 4/1970 | Strange |
| 3,732,513 A |  | 5/1973 | Farrand |
| 4,853,604 A | * | 8/1989 | McMullin ............ G01D 5/2053 318/653 |
| 5,939,879 A |  | 8/1999 | Wingate et al. |
| 6,466,010 B1 | * | 10/2002 | Moerbe .................. B60T 7/042 324/207.21 |

(Continued)

FOREIGN PATENT DOCUMENTS

| CN | 101936749 A | 1/2011 |
|---|---|---|
| CN | 102741661 A | 10/2012 |

(Continued)

OTHER PUBLICATIONS

Kurita et al., "Flying-Height Reduction of Magnetic-Head Slider Due to Thermal Protrusion," IEEE Transactions on Magnetics 41(10): 3007-09 (2005).

(Continued)

*Primary Examiner* — David M Schindler
(74) *Attorney, Agent, or Firm* — Mintz Levin Cohn Ferris Glovsky; Peter F. Corless; Steven M. Jensen

(57) ABSTRACT

A magnetic position detecting device and a method for detecting a magnetic position are provided. An induced voltage is generated by changing a position between a pattern of an inductive ruler and an alternating magnetic field of an exciting element. A position of the exciting element is resolved by a technical means of voltage resolution for positions.

14 Claims, 13 Drawing Sheets

(56) References Cited

U.S. PATENT DOCUMENTS

| | | | |
|---|---|---|---|
| 6,504,361 B1 * | 1/2003 | Gleixner | G01D 5/165 324/207.12 |
| 6,922,051 B2 * | 7/2005 | Gleixner | G01D 5/2073 324/207.17 |
| 6,999,007 B2 * | 2/2006 | Lin | G01D 5/2073 178/18.06 |
| 7,221,151 B2 | 5/2007 | Schroeder et al. | |
| 9,250,102 B2 | 2/2016 | Takahashi et al. | |
| 2004/0008025 A1 | 1/2004 | Johnson et al. | |
| 2007/0139040 A1 * | 6/2007 | Jones | D06F 34/18 324/207.17 |
| 2008/0224806 A1 | 9/2008 | Ogden et al. | |

FOREIGN PATENT DOCUMENTS

| | | |
|---|---|---|
| CN | 107430207 A | 12/2017 |
| CN | 103891114 B | 1/2018 |
| TW | M312654 U | 5/2007 |
| TW | 200806956 A | 2/2008 |
| TW | M504952 U | 7/2015 |

OTHER PUBLICATIONS

Takahashi, "3D analysis of magnetization distribution magnetized by capacitor-discharge impulse magnetizer," Journal of Materials Processing Technology 108: 241-45 (2001).

Kikuchi et al., "Considerations of output voltage waveform on magnetic linear encoder for artificial heart using linear pulse motor," Sensors and Actuators 81: 309-12 (2000).

Kikuchi et al., "Consideration for a high resolution of magnetic rotary encoder," IEEE Transactions on Magnetics 32(5): 4959-61 (1996).

Luo et al., "Multi-Pole Magnetization of High Resolution Magnetic Encoder," Proceedings of Electrical/Electronics Insulation Conference, IEEE, 237-42 (1993).

Van Hoang et al., "An Efficient Approach to Correct the Signals and Generate High-Resolution Quadrature Pulses for Magnetic Encoders," IEEE Transactions on Industrial Electronics 58(8): 3634-46 (2011).

* cited by examiner

MAGNETIC POSITION DETECTING DEVICE AND METHOD

BACKGROUND

1. Technical Field

This disclosure relates to position detecting techniques, and, more particularly, to a magnetic position detecting device and a method for detecting a magnetic position.

2. Description of Related Art

High precision position detecting components include an optical ruler and a magnetic ruler, which are widely applied to precision mechanic industry (e.g., tool machines) and intellectual manufacturing industry (e.g., precision mechanic arms). Processing equipment often requires product processing in harsh environments. Compared with the optical ruler, the magnetic ruler has a simple structure and can be applied to a highly contaminated environment. Therefore, high-end magnetic rulers are developed rapidly, and are replacing the middle-end optical rulers gradually.

However, the magnetic ruler encounters a bottleneck that its magnetic pole width has to be kept thinning or miniaturized. And the magnetic ruler suffers from the stability problem of resolving pattern position by the voltage phase shift due to the assembly control. As a result, the magnetic ruler is neither precise enough nor stable. Moreover, the problem of time consuming when magnetization also makes the high-order magnetic ruler less prone to be scaled up.

Therefore, how to solve the problems of abovementioned is becoming an urgent issue in the art.

SUMMARY

This disclosure provides a magnetic position detecting device, comprising: an exciting element configured for generating an alternating magnetic field; an inductive ruler with a pattern and generating an inductive voltage based on a relative position change between the pattern and the exciting element; and a position resolving element configured for capturing the inductive voltage and resolving a position of the exciting element on the inductive ruler based on the inductive voltage.

This disclosure further discloses a method for detecting a magnetic position, comprising: forming a pattern on an inductive ruler; generating an alternating magnetic field by an exciting element; generating an inductive voltage based on a position change between the pattern and the exciting element; and capturing, by a position resolving element, the inductive voltage, and resolving a position of the exciting element on the inductive ruler based on the inductive voltage.

BRIEF DESCRIPTION OF DRAWINGS

The disclosure can be more fully understood by reading the following detailed description of the embodiments, with reference made to the accompanying drawings, wherein.

DETAILED DESCRIPTION

Figure 1:
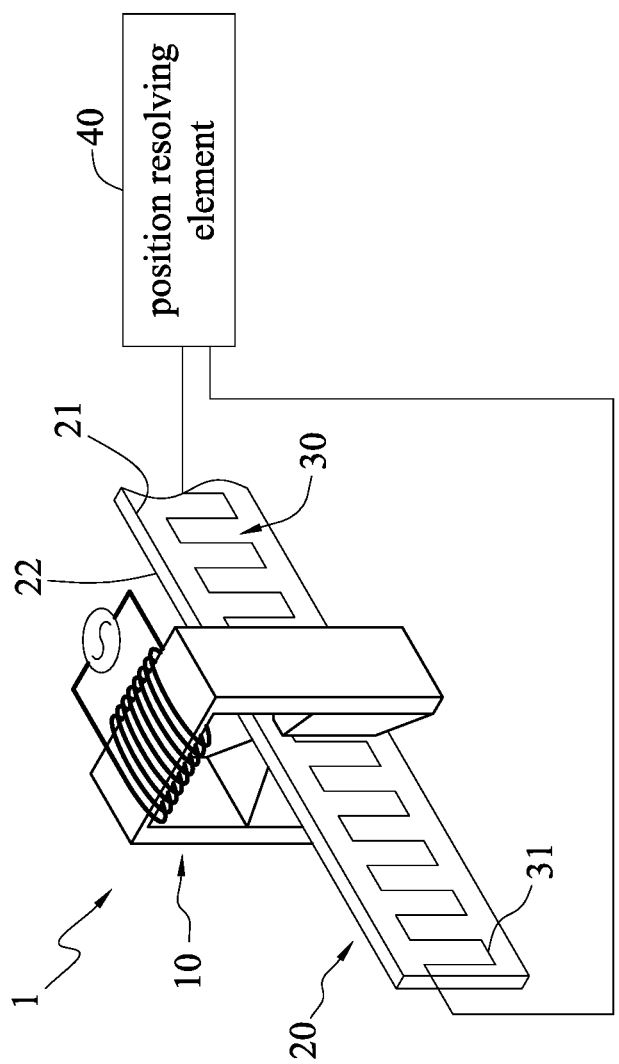
FIG. 1 is a schematic diagram of a magnetic position detecting device of a first embodiment according to this disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a schematic diagram of a magnetic position detecting device 1 of a first embodiment according to this disclosure. The magnetic position detecting device 1 comprises: an exciting element 10 applied with AC power to generate an alternating magnetic field; an inductive ruler 20 formed with a pattern 30, configured for generating an inductive voltage based on a position change between the pattern and the exciting element 10; and a position resolving element 40 connected to the inductive ruler 20 for reading the inductive voltage generated by the inductive ruler 20 and resolving a position of the exciting element 10 on the inductive ruler 20 based on the inductive voltage.

In an embodiment, the pattern 30 of the inductive ruler 20 is constituted by a metal wire.

In an embodiment, the pattern 30 of the inductive ruler 20 is a periodic wave pattern, and two ends of the pattern 30 are both connected to the position resolving element 40. The position resolving element 40 is allowed to read the inductive voltage generated as the pattern 30 moves within the alternating magnetic field. Each relative position between the pattern 30 and the exciting element 10 has a corresponding inductive voltage.

Figure 2:
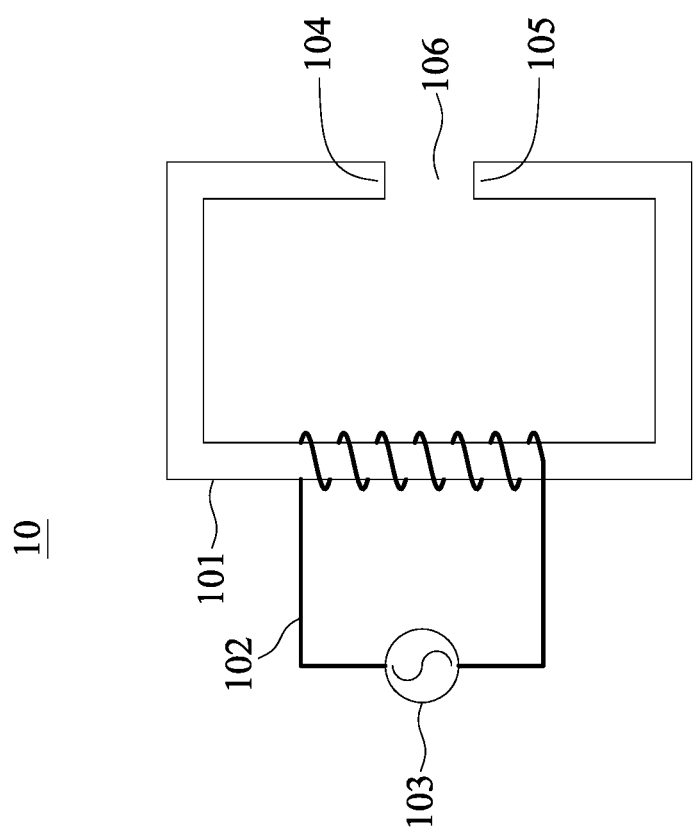
FIG. 2 is a schematic diagram of an exciting element of the magnetic position detecting device of the first embodiment according to this disclosure.

FIG. 2 is a side view of the exciting element 10 of a first embodiment according to this disclosure. The exciting element 10 comprises a magnetic conductivity part 101, a winding part 102, an AC power supply unit 103, a first magnetic pole part 104, a second magnetic pole part 105, and an opening 106.

The magnetic conductivity part 101 is in the shape of a ring having the opening 106. The first magnetic pole part 104 and the second magnetic pole part 105 are disposed on two ends of the magnetic conductivity part 101, respectively. The opening 106 is disposed between the first magnetic pole part 104 and the second magnetic pole part 105. The winding part 102 has a coil structure and winds around the magnetic conductivity part 101. The exciting element 10 moves on the pattern 30 of the inductive ruler 20 through the opening 106, or the exciting element 10 is fixed and allowed the inductive ruler 20 to move in the opening 106.

The AC power supply unit 103 applies AC power to the winding part 102 to generate the alternating magnetic field, allowing positions of the pattern 30 of the inductive ruler 20 to change within the alternating magnetic field. The pattern 30 moving within the alternating magnetic field generates the inductive voltage. Each relative position between the pattern 30 and the exciting element 10 has a corresponding inductive voltage.

Figure 3:
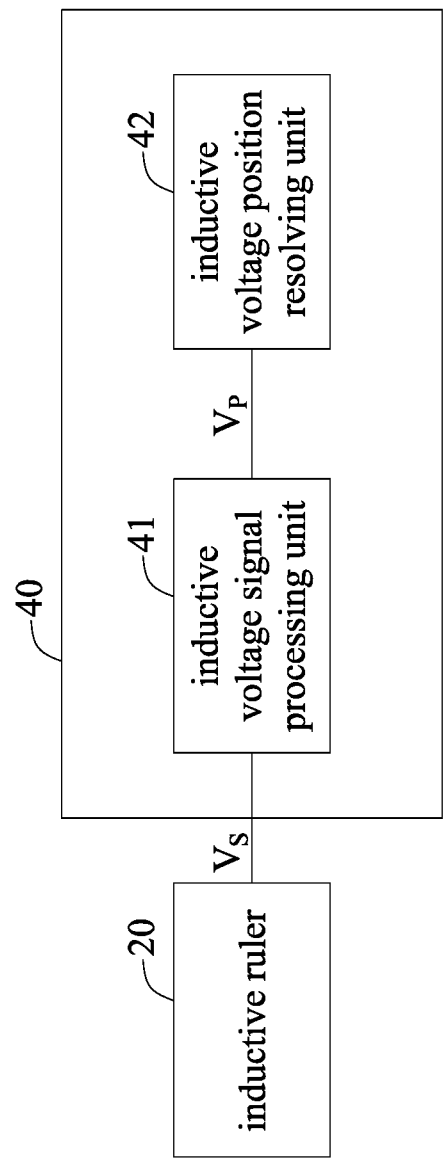
FIG. 3 is a schematic diagram of a position resolving element of the magnetic position detecting device of the first embodiment according to this disclosure.

FIG. 3 is a schematic diagram of a position resolving element 40 of the magnetic position detecting device 1 according to this application. The position resolving element 40 comprises: an inductive voltage signal processing unit 41 and an inductive voltage position resolving unit 42. The inductive voltage signal processing unit 41 is connected to the pattern 30 of the inductive ruler 20. The inductive voltage signal processing unit 41 is configured for reading the inductive voltage $V_S$ generated by a position change between the pattern 30 and the exciting element 10. The inductive voltage signal processing unit 41 filters and wave detects the inductive voltage $V_S$ to obtain a process voltage $V_P$. The inductive voltage position resolving unit 42 is connected to the inductive voltage signal processing unit 41 for receiving the process voltage $V_P$. The inductive voltage position resolving unit 42 resolves the position of the exciting element 10 on the inductive ruler 20 based on a relation that a period of the process voltage $V_P$ corresponding to a length of an X-coordinate is equal to a period of the pattern 30 of the inductive ruler 20 corresponding to a distance of an X-coordinate.

Figure 4:
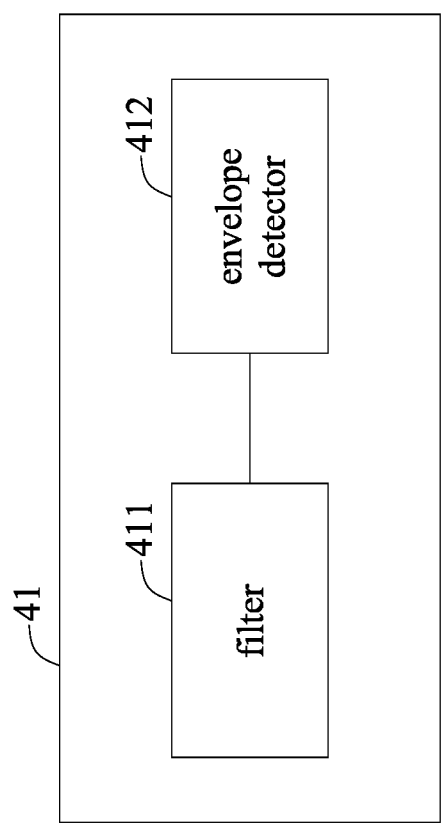
FIG. 4 is a schematic diagram of an inductive voltage signal processing unit of the magnetic position detecting device of the first embodiment according to this disclosure.

FIG. 4 is a schematic diagram of an inductive voltage signal processing unit 41 of a first embodiment according to this disclosure. The inductive voltage signal processing unit 41 comprises a filter 411 and an envelope detector 412. The filter 411 is configured for filtering out carrier frequencies of the AC power in the inductive voltage $V_S$. The envelope detector 412 is connected to the filter 411, and the envelope detector 412 is configured for wave detecting the inductive voltage $V_S$ such that the carrier frequencies are filtered out so as to obtain the process voltage $V_P$.

In an embodiment, the filter 411 is a low-pass filter.

In an embodiment, the inductive voltage signal processing unit 41 further comprises a first amplifier (not shown). The first amplifier has an output end connected to an input end of the filter 411. And the first amplifier has an input end connected to the pattern 30 of the inductive ruler 20. The inductive voltage is obtained from the inductive ruler 20 and is generated by the position variation between the pattern 30 and the alternating magnetic field. And the inductive voltage is amplified and then outputted to the filter 411. However, this disclosure is not so limited.

In an embodiment, the inductive voltage signal processing unit 41 further comprises a level shifter (not shown) and a second amplifier (not shown). The level shifter is connected to the envelope detector 412, and the level shifter is configured for shifting the level (e.g., a voltage level) of the process voltage $V_P$ for subsequent works. The second amplifier is connected to the level shifter, and the second amplifier is configured for amplifying and outputting the process voltage $V_P$ that has been level shifted to the inductive voltage position resolving unit 42. However, this disclosure is not so limited.

In an embodiment, the position resolving element 40 further comprises an analog digital converter (not shown) disposed between the inductive voltage signal processing unit 41 and the inductive voltage position resolving unit 42. The analog digital converter is configured for converting the process voltage $V_P$, which receives from the inductive voltage signal processing unit 41, into a process voltage $V_P$ in the form of a digital signal. And the process voltage $V_P$ of the digital signal is transmitted to the inductive voltage position resolving unit 42. However, this disclosure is not so limited.

Figure 5A:
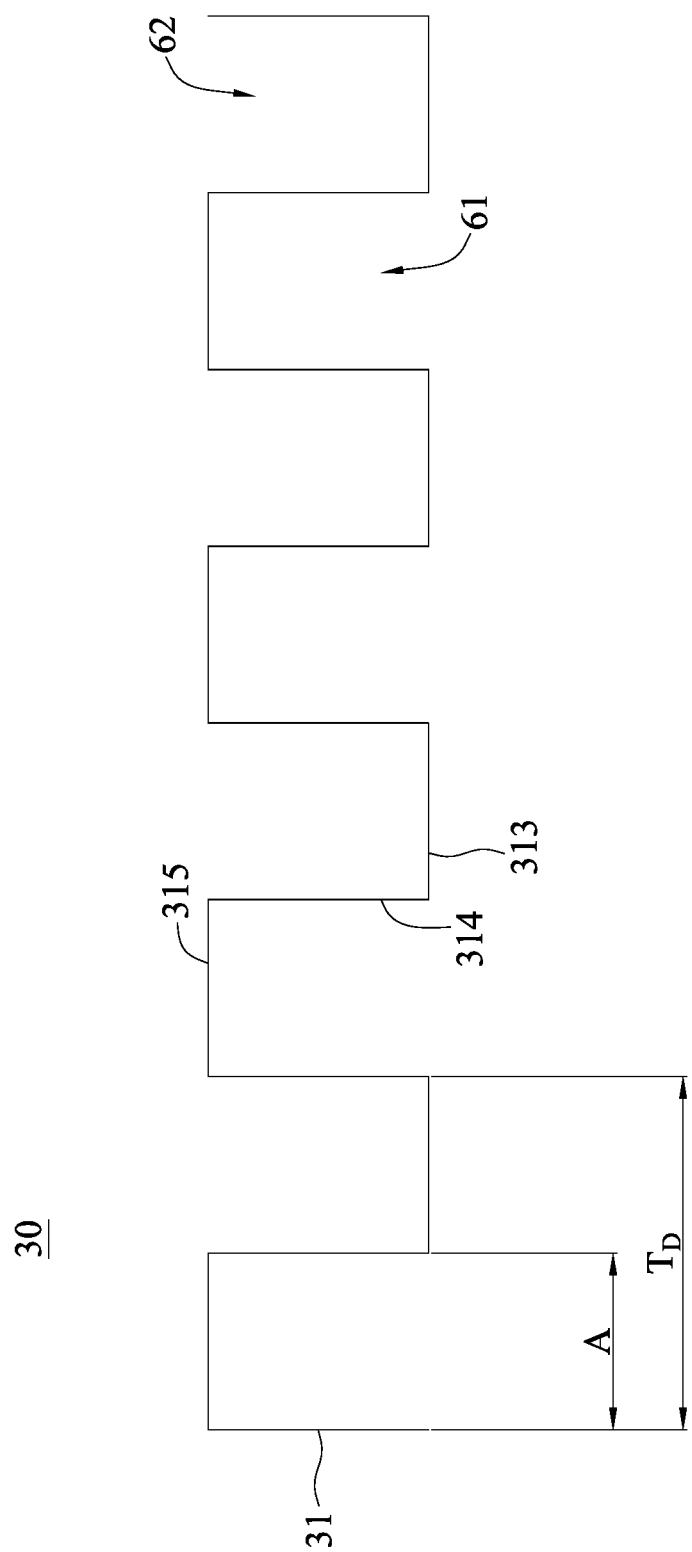
FIG. 5A is a schematic diagram of a pattern of an inductive ruler of the magnetic position detecting device of the first embodiment according to this disclosure.

FIG. 5A is a schematic diagram of the pattern 30 of the inductive ruler 20 of a first embodiment according to this disclosure. The pattern 30 of the first embodiment is a square wave 31 and is formed on only a front side 21 or a rear side 22 opposing to the front side 21 of the inductive ruler 20 shown in FIG. 1. The square wave 31 comprises a plurality of first pulse valley horizontal portions 313, a plurality of first pulse vertical portions 314 and a plurality of first pulse top horizontal portions 315, and has a line width of 1 mm. And a pitch distance (A) between any two neighboring ones of the first pulse vertical portions 314 is 4 mm. The period ($T_D$) of the square wave 31 corresponds to a distance in the X-coordinate that is 8 mm. An area where the opening of the square wave 31 facing downward is a positive square wave area 61, while another area where the opening of the square wave 31 facing upward is a negative square wave area 62.

Figure 5C:
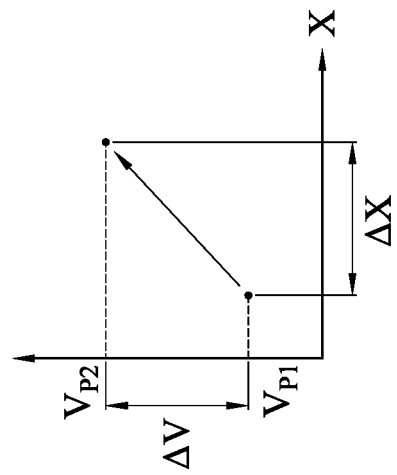
FIGS. 5B and 5C are schematic diagrams of processing an inductive voltage of the magnetic position detecting device of the first embodiment according to this disclosure.
Figure 5B:
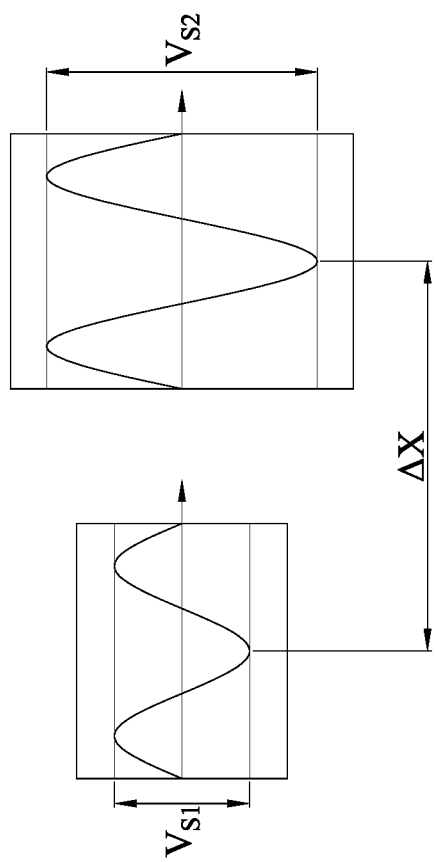

FIG. 5B is a schematic diagram of a waveform of the inductive voltage of the first embodiment. The position resolving element 40 resolves the inductive voltage that the pattern 30 interacts with the alternating magnetic field. After the exciting element 10 moves a distance $\Delta X$ on the inductive ruler 20, the pattern 30 of the inductive ruler 20 (alternating magnetic field does not change) generates corresponding change of the inductive voltage (the amplitude of the inductive voltage waveform is changed). A relative position change between the pattern 30 and the exciting element 10 results in a change of corresponding inductive voltage. Therefore, a relation from the inductive voltage $V_{S1}$ to the inductive voltage $V_{S2}$ is corresponding to a relation of the exciting element 10 moving the distance $\Delta X$ on the inductive ruler 20. Since the inductive voltage comprises the amplitude of the carrier frequencies of the AC power 103, there is an amplitude change when the inductive voltage $V_{S1}$ moves to the inductive voltage $V_{S2}$ because of the distance $\Delta X$.

FIG. 5C is a schematic diagram of a process voltage obtained by the position resolving element 40 resolving the inductive voltage of FIG. 5B. After the inductive voltages $V_{S1}$ and $V_{S2}$ having changed amplitudes are then filtered and wave detected by the inductive voltage signal processing unit 41, the process voltages $V_{P1}$ and $V_{P2}$ that do not have carrier frequencies are obtained. Since the process voltage corresponds to the inductive voltage, the changing ΔV relation from the process voltage $V_{P1}$ to the process voltage $V_{P2}$ is also corresponding to the changing of the distance ΔX.

After the exciting element 10 generates the alternating magnetic field, the inductive voltage signal processing unit 41 filters and wave detects the inductive voltage $V_S$. The inductive voltage $V_S$ is generated by the pattern 30 interacting with the alternating magnetic field. The process voltage 311 in the shape of a quasi-triangular wave is obtained and shown in FIG. 5D. The inductive voltage position resolving unit 42 captures all bands of the process voltage 311 in the form of the quasi-triangular wave shown in FIG. 5D as an analyzed band. And the period ($T_L$) of a process voltage of the analyzed band corresponds to a length in the X-coordinate. The period ($T_D$) of the square wave 31 corresponds to a distance unit in the X-coordinate. The variation of the process voltage of the analyzed band based on the distance unit is equivalent to the moving distance of the exciting element 10 on the inductive ruler 20. Therefore, the position of the exciting element 10 on the inductive ruler 20 can be resolved from the analyzed band.

Figure 5D:
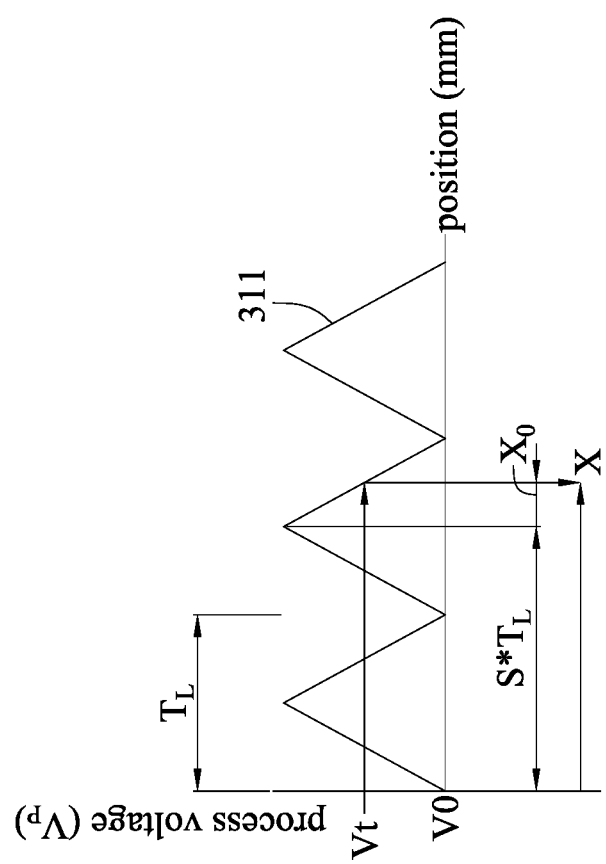
FIG. 5D is a schematic diagram of a magnetic position sensing waveform of the magnetic position detecting device of the first embodiment according to this disclosure.

It should be appreciated that the process voltage $V_{P1}$ corresponds to the inductive voltage $V_{S1}$ and the variation of the inductive voltage $V_{S1}$ corresponds to the moving distance of the exciting element 10 on the pattern 30. The length in the X-coordinate corresponding to the period ($T_L$) of the process voltage shown in FIG. 5D is equal to a distance in the X-coordinate corresponding to the period ($T_D$) of the pattern 30. The equation is shown as $X=S\times T_L + X_0 = S\times T_L + (V_t - V_0)/m$, where X is the position of the exciting element 10 on the inductive ruler 20, S is the number of periods of the analyzed band (0, 0.5, 1, 1.5, . . . ), $T_L$ is the distance of the periods of the analyzed band, $X_0$ is the distance from the process voltage of the Sth period to X, $V_t$ is the value of the process voltage, $V_0$ is a linear initial voltage value of the Sth period, and m is a slope value of (X, $V_t$).

Figure 5E:
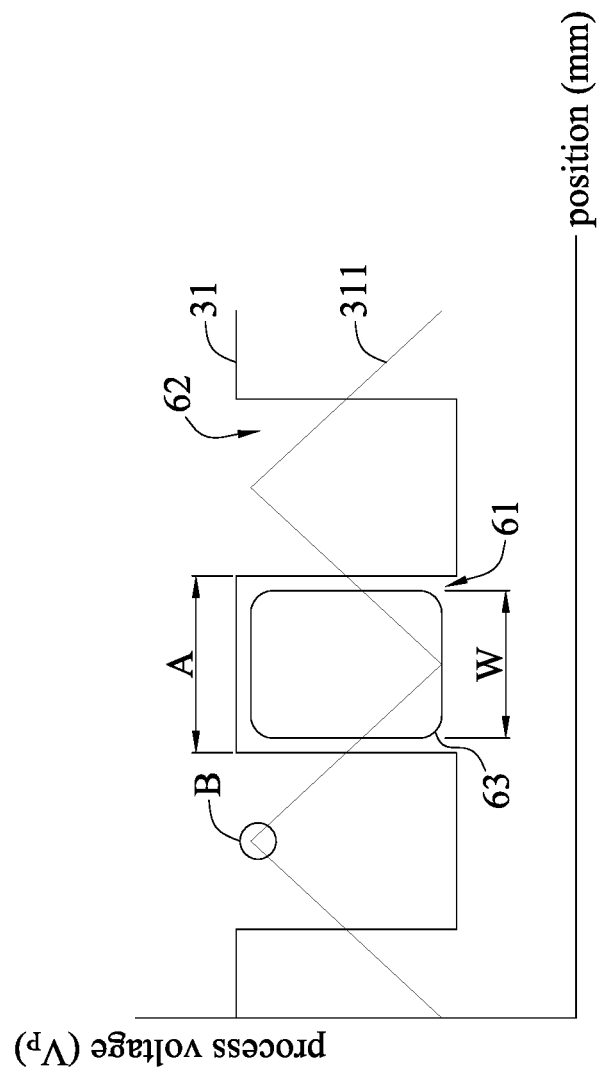
FIG. 5E is a schematic diagram of a relation between a square wave and a process voltage of the magnetic position detecting device of the first embodiment according to this disclosure.
Figure 5F:
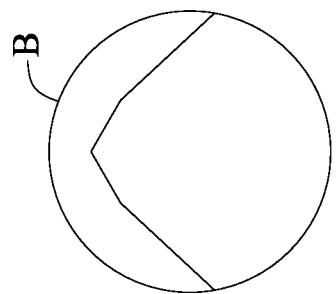
FIG. 5F is an enlarged diagram of a turning portion of a process voltage of the magnetic position detecting device of the first embodiment according to this disclosure.

FIG. 5E is a schematic diagram of a relation between the square wave 31 on the inductive ruler 20 and the process voltage 311 of a first embodiment according to this disclosure. The relative position change between the square wave 31 and the exciting element 10 generates the process voltage 311 in the form of a corresponding quasi-triangular wave. In the process voltage 311 in the form of the quasi-triangular wave shown in FIG. 5F, the peak and valley turning areas (e.g., the peak turning area B shown in FIG. 5E) are arc-shaped.

Figure 6A:
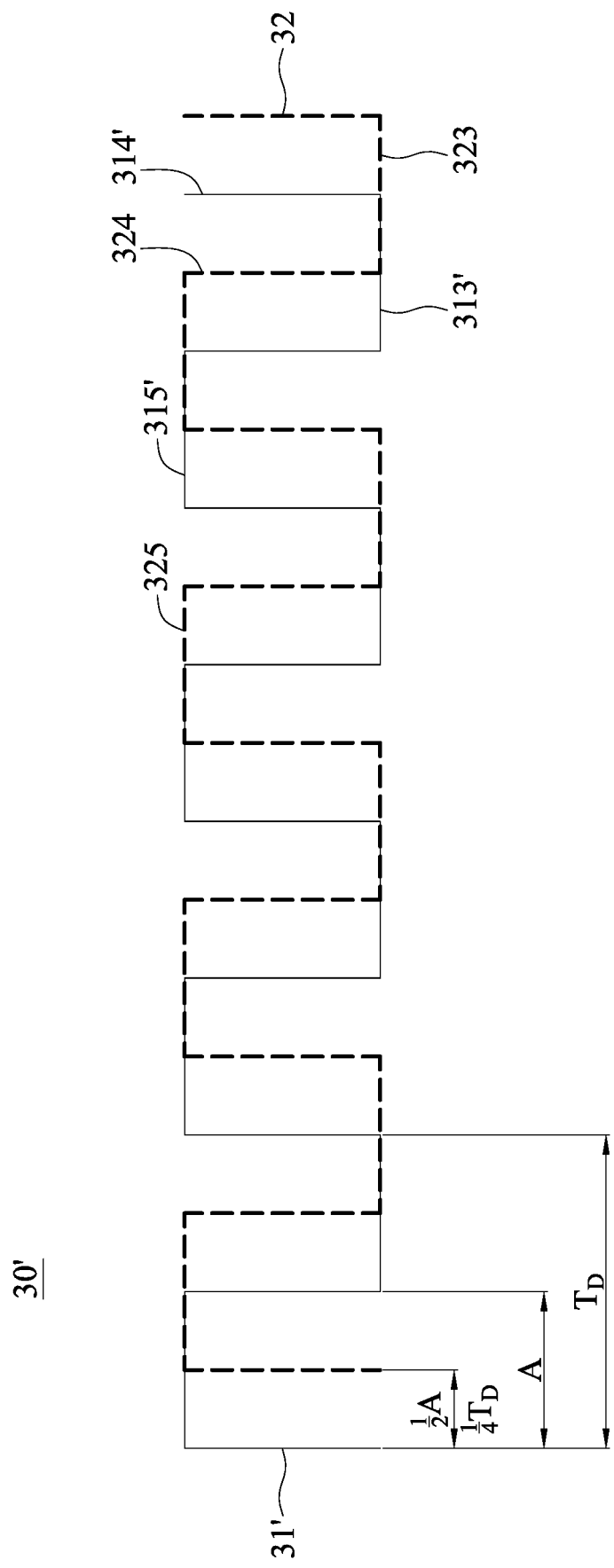
FIG. 6A is a schematic diagram of a pattern of an inductive ruler of a magnetic position detecting device of a second embodiment according to this disclosure.

FIG. 6A is a schematic diagram of a pattern 30' of a second embodiment of the magnetic position detecting device 1 according to this disclosure. The second embodiment differs from the first embodiment in the pattern 30', and only the difference will be described in the following paragraphs. The pattern 30' comprises a first graph 31' formed on the front side 21 of the inductive ruler 20 shown in FIG. 1 and a second graph 32 formed on the rear side 22 of the inductive ruler 20 shown in FIG. 1. The first graph 31' and the second graph 32 are in an identical horizontal line, and the first graph 31' and the second graph 32 have the same graph but differs from each other by a ½ pitch distance (A) or a ¼ period ($T_D$). The first graph 31' is a square wave composed of a plurality of first pulse valley horizontal portions 313', a plurality of first pulse vertical portions 314', and a plurality of first pulse top horizontal portions 315'. The second graph 32 is a square wave composed of a plurality of second pulse valley horizontal portions 323, a plurality of second pulse vertical portions 324, and a plurality of second pulse top horizontal portions 325.

Figure 6B:
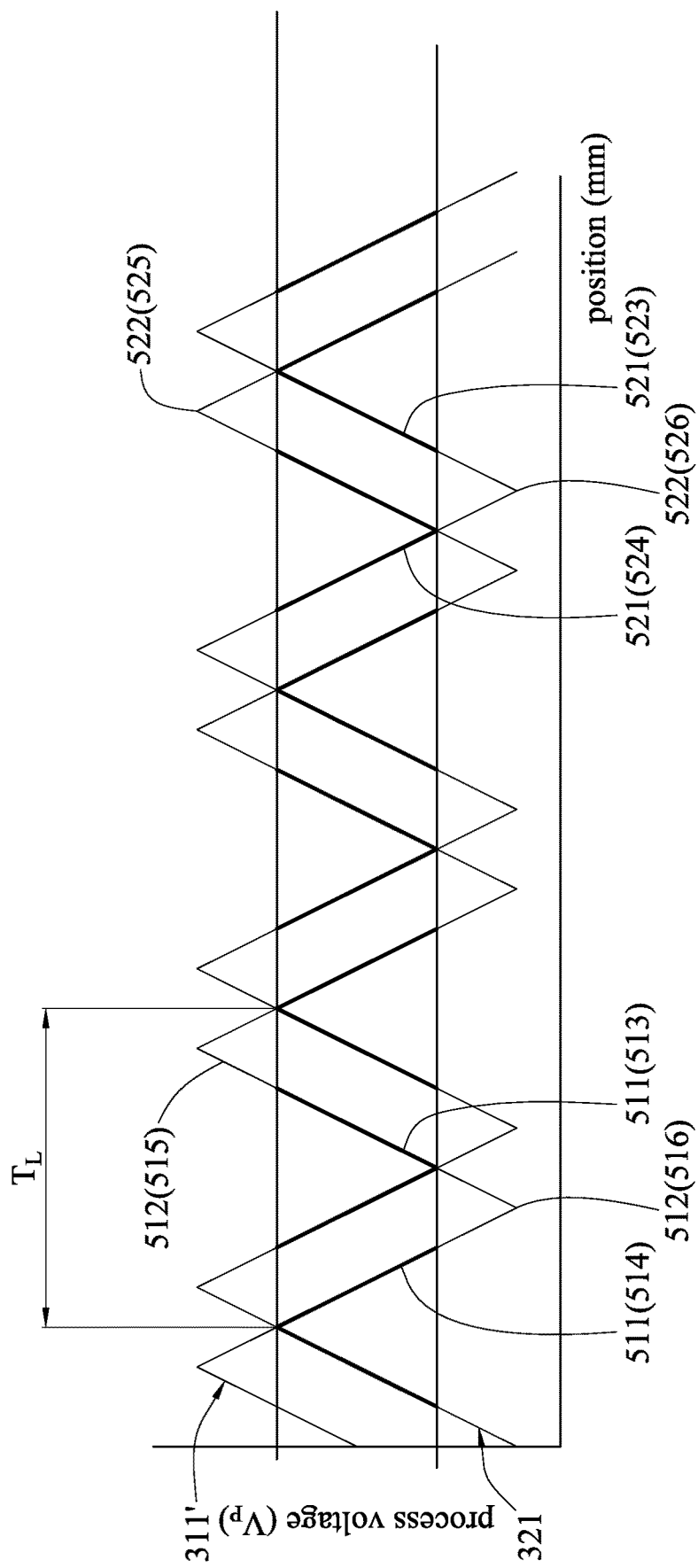
FIG. 6B is a schematic diagram of a magnetic position sensing waveform of the magnetic position detecting device of the second embodiment according to this disclosure.

The first graph 31' of the second embodiment generates a first inductive voltage as a relative position between the first graph 31' and the exciting element 10 changes, and the second graph 32 generates a second inductive voltage as a relative position between the second graph 32 and the exciting element 10 changes. The inductive voltage signal processing unit 41 processes the inductive voltages to obtain a first process voltage 311' corresponding to the first graph 31' and a second process voltage 321 corresponding to the second graph 32. The first process voltage 311' and the second process voltage 321 being in an identical horizontal line but differing from each other by a ¼ period, as shown in FIG. 6B. The first process voltage 311' and the second process voltage 321 are in the form of a quasi-triangular wave. It is known from FIG. 6A that the first graph 31' differs from the second graph 32 by a ½ pitch distance (A) or a ¼ period ($T_D$). Therefore, the first process voltage 311' also differs from the second process voltage 321 by a ¼ period ($T_D$).

The waveforms of first non-turning curve bands 511 of the first process voltage 311' and second non-turning curve bands 521 of the second process voltage 321 are determined as non-turning portions, which have a constant slope. The waveforms of a first turning curve segment 512 of the first process voltage 311' and a second turning curve segment 522 of the second process voltage 321 are determined as turning portions, which do not approach a constant slope due to the switching of positive and negative slopes. The first non-turning curve bands 511 comprise a first ascending segment 513 and a first descending segment 514. The second non-turning curve bands 521 comprise a second ascending segment 523 and a second descending segment 524. The first turning curve segment 512 comprises a first peak region 515 and a first valley region 516. The second turning curve segment 522 comprises a second peak region 525 and a second valley region 526.

The inductive voltage position resolving unit 42 captures the first ascending segment 513 and the first descending segment 514, and deducts the first peak region 515 and the first valley region 516 of the first process voltage 311'. Similarly, the inductive voltage position resolving unit 42 captures the second ascending segment 523 and the second descending segment 524 (as shown by the thick line segment of FIG. 6B) only, and deducts the second peak region 525 and the second valley region 526 of the second process voltage 321. Thus, all the ascending segments and descending segments of the first process voltage 311 and the second process voltage 321 are collected and formed as an analyzed band of positively (upward) and inversely (downward) interlaced triangular waves shown in FIG. 6C. The period ($T_L$) of the process voltage of the analyzed band corresponds to the length in the X-coordinate. The period ($T_D$) of the first graph 31' or the second graph 32 corresponds to the distance in the X-coordinate. The distance variation of the process voltage of the analyzed band is equivalent to the moving distance of the exciting element 10 on the inductive ruler 20. The position sensing waveform shown in FIG. 6C is thus complete, and the position of the exciting element 10 on the inductive ruler 20 can be resolved from the analyzed band.

It should be appreciated that the first graph 31' corresponds to the first process voltage 311' and the second graph 32 corresponds to the second process voltage 321. The period ($T_L$) of the process voltage shown in FIG. 6C corresponding to a length of the X-coordinate is equivalent to the period ($T_D$) of the first graph 31' or the second graph 32 corresponding to the distance of the X-coordinate.

Since the inductive voltage position resolving unit 42 only captures the non-turning curve bands 511 and 521 that have an approximately constant slope, the pattern 30' of the second embodiment can increase precision of the position detection of the exciting element 10. In the second embodiment, back to FIG. 6A, the distance of the period ($T_D$) of the first graph 31' and the second graph 32 in the X-coordinate is 8 mm, the pitch distance (A) is 4 mm, and the line width is 1 mm. And the first graph 31' and the second graph 32 are staggered by 2 mm (¼$T_D$ or ½A). By retrieving the analyzed band of the non-turning curve bands of the first process voltage 311' and the second process voltage 321, the repeatability precision error range and positioning precision of the position detection of the exciting element 10 can be obtained. Wherein the repeatability (position precision) precision error range is ±0.003 mm and the best positioning precision is 0.01 mm.

Figure 6C:
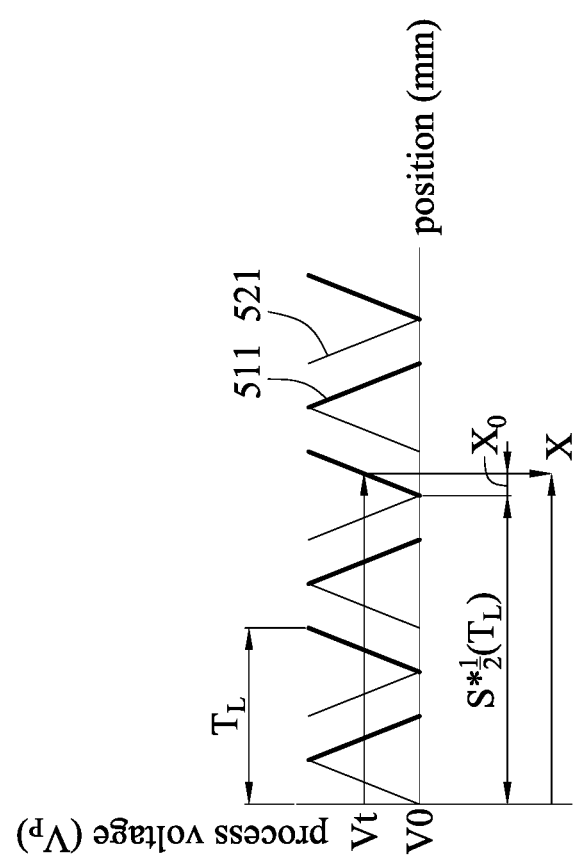
FIG. 6C is a schematic diagram of an analyzed band of the magnetic position detecting device of the second embodiment according to this disclosure.

As shown in FIG. 6C of the second embodiment, the inductive voltage position resolving unit 42 further comprises providing a position conversion algorithm, X=S×½($T_L$)+$X_0$=S×½($T_L$)+($V_t$−$V_0$)/m, which can calculate the position (X) of the exciting element 10 on the inductive ruler 20 directly. Where X is the position of the exciting element 10 on the inductive ruler 20, S is the number of periods of the analyzed band (e.g., 0, 0.5, 1, 1.5, . . . ), $T_L$ is the distance of the periods of the analyzed band, $X_0$ is the distance from the process voltage of the Sth period to X, $V_t$ is the value of the process voltage, $V_0$ is the linear initial voltage value of the Sth period, and m is the slope value of (X, $V_t$). There are many other position conversion algorithms, and this disclosure is not limited to the above-mentioned. After calculation of several periods $T_L$, S×½($T_L$) can be known. The slope value m can be known from the ascending segment and the descending segment of the triangular wave, the linear initial voltage value $V_0$ of the Sth period is also known. After the value of the process voltage $V_t$ is measured, the distance $X_0$ from the inductive voltage of the Sth period to X can be calculated. And the position X of the exciting element 10 on the inductive ruler 20 can be calculated accordingly.

Figure 7:
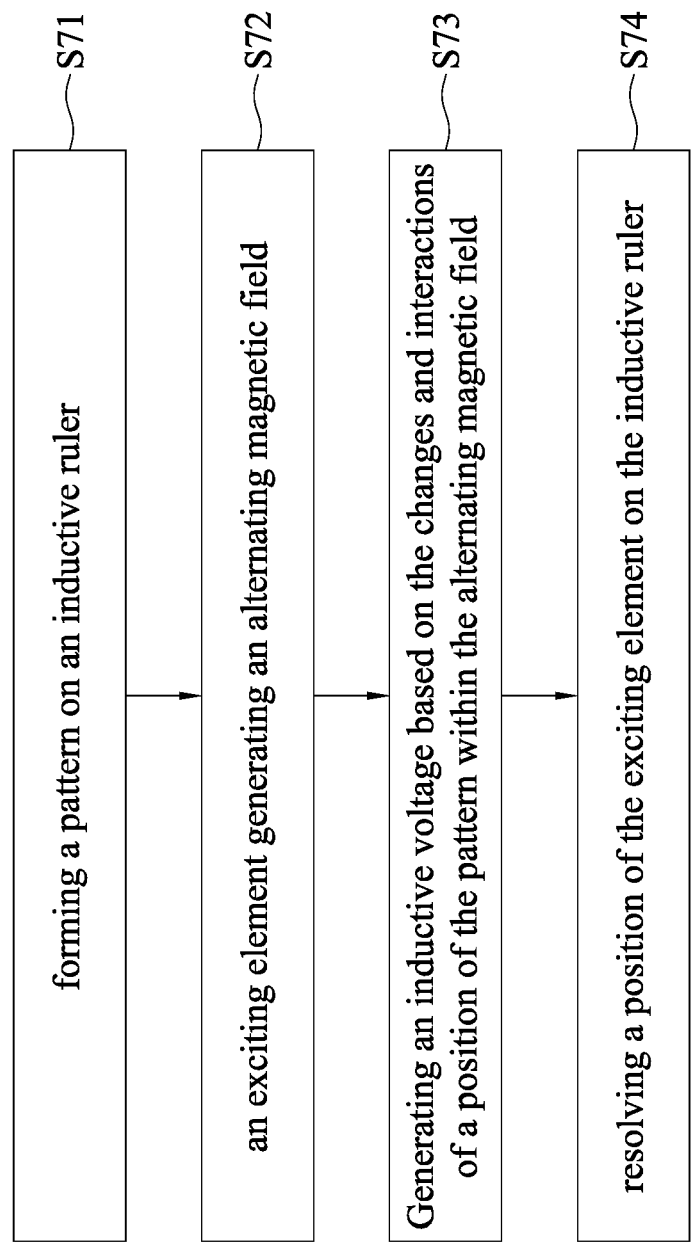
FIG. 7 is a flow chart of a method for detecting a magnetic position of a first embodiment according to this disclosure.

FIG. 7 is a flow chart of a method for detecting a magnetic position of a first embodiment (i.e., the single-sided pattern ruler shown in FIG. 5A) according to this disclosure. In step S71, a pattern 30 is formed on an inductive ruler 20. In step S72, the exciting element 10 generates an alternating magnetic field. In step S73, a position of the pattern 30 changes and interacts within the alternating magnetic field, and an inductive voltage is thus generated. The relative position change between the pattern 30 and the exciting element 10 generates the inductive voltage. In step S74, the position resolving element 40 captures the inductive voltage, and the position resolving element 40 resolves the position of the exciting element 10 on the inductive ruler 20 based on the inductive voltage.

In step S72, an AC power supply unit 103 applies AC power to the exciting element 10 to generate the alternating magnetic field.

Figure 8:
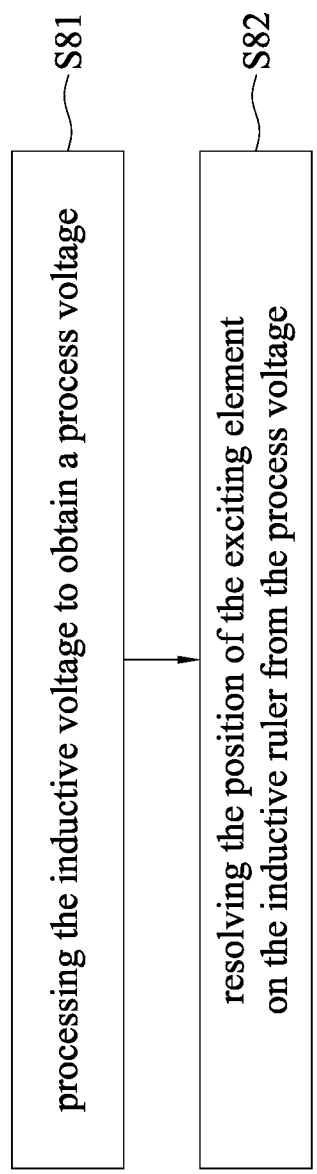
FIG. 8 is a flow chart of step S74 of the method for detecting a magnetic position of the first embodiment according to this disclosure.

FIG. 8 is a flow chart of step S74. In step S81, the inductive voltage signal processing unit 41 reads the inductive voltage $V_S$ from the inductive ruler 20. The inductive voltage $V_S$ is generated by a relative position change between the pattern 30 and the exciting element 10. The inductive voltage signal processing unit 41 filters and wave detects the inductive voltage $V_S$ to obtain the process voltage $V_P$. In step S82, the inductive voltage position resolving unit 42 reads the process voltage $V_P$. And the inductive voltage position resolving unit 42 resolves the position of the exciting element 10 on the inductive ruler 20 from the process voltage. The resolution is based on a relation that the length of the X-coordinate corresponding to the period of the process voltage is equal to the distance of the X-coordinate corresponding to the period of the pattern 30 of the inductive ruler 20.

In an embodiment, step S81 comprises: using a low-pass filter (i.e., the filter 411 of FIG. 4) to filter the inductive voltage, and filtering out carrier frequencies of the AC power in the inductive voltage $V_S$; and using the envelope detector (i.e., the envelope detector 412 of FIG. 4) wave detects the inductive voltage $V_S$ that the carrier frequencies has been filtered out, to obtain the process voltage $V_P$.

In the first embodiment, in step S71 the pattern 30 of the square wave 31 is formed on the front side 21 or the rear side 22 opposing to the front side 21 of the inductive ruler 20. In step S81, the inductive voltage signal processing unit 41 reads the inductive voltage from the inductive ruler 20. The inductive voltage is generated by a relative position change between the square wave 31 and the exciting element 10. And the inductive voltage $V_S$ is filtered and wave detected to obtain the process voltage 311 in the form of a quasi-triangular wave. And in step S82, the inductive voltage position resolving unit 42 reads the process voltage 311 in the form of the quasi-triangular wave, enables all bands of the process voltage 311 as an analyzed band. There is a relation that the period of the process voltage corresponding to the length of the X-coordinate is equal to the period of the square wave 31 on the inductive ruler 20 corresponding to the distance of the X-coordinate. That is, the period ($T_L$) of process voltage of the analyzed band corresponding to a length of an X-coordinate is equal to the period ($T_D$) of the square wave 31 corresponding to the distance of the X-coordinate, such that the position sensing waveform is completed and shown in FIG. 5B. The variation of the process voltage of the analyzed band as the distance changes is corresponding to the moving distance of the exciting element 10 on the inductive ruler 20. Therefore, the position of the exciting element 10 on the inductive ruler 20 can be resolved from the analyzed band.

This disclosure further provides a method for detecting a magnetic position of a second embodiment (i.e., the double-sided pattern ruler shown in FIG. 6A). The second embodiment differs from the first embodiment in the pattern 30', and only the difference will be described in the following paragraphs. In step S71, two patterns on an identical horizontal line are formed on the front side 21 and the rear side 22 of the inductive ruler 20, respectively. The two patterns are the first graph 31' and the second graph 32 that are square waves, and differ from each other by a ½ pitch distance or a ¼ period (as shown in FIG. 6A). In step S81, the inductive voltage signal processing unit 41 processes the inductive voltage to obtain two process voltages (i.e., the first process voltage 311' and the second process voltage 321). The inductive voltage is generated by a relative position between the two patterns and the alternating magnetic field. The two process voltages (i.e., the first process voltage 311' and the second process voltage 321) are in the form of a quasi-triangular wave and disposed on an identical horizontal line, and the two process voltages differ from each other by a ¼ period. In step S82, the inductive voltage position resolving unit 42 reads the first process voltage 311' and the second process voltage 321. And the inductive voltage position resolving unit 42 captures non-turning curve bands (i.e., the first non-turning curve bands 511 and the second non-turning curve bands 521 of the first process voltage 311' and the second process voltage 321) to obtain an analyzed band. The analyzed band is in the form of positively (upward) and inversely (downward) interlaced triangular waves (as shown in FIG. 6C). There is a relation that the period of the process voltage corresponding to the length of the X-coordinate is equal to the period of the first graph 31' or the second graph 32 corresponding to the distance of the X-coordinate. That is, the period ($T_L$) of process voltage of the analyzed band corresponding to the length of an X-coordinate is equal to the period ($T_D$) of the first graph 31' or the second graph 32 corresponding to the distance unit of the X-coordinate. The position sensing waveform is completed and shown in FIG. 6C. The variation of the process voltage of the analyzed band as the distance changes is corresponding to the moving distance of the exciting element 10 on the inductive ruler 20. Therefore, the position of the exciting element 10 on the inductive ruler 20 can be resolved from the analyzed band.

In the first embodiment of the method (i.e., the single-sided pattern ruler shown in FIG. 5A), in step S82 a position conversion algorithm, $X=S\times T_L+X_0=S\times T_L+(V_t-V_0)/m$, is provided to calculate the position (X) of the exciting element 10 on the inductive ruler 20 directly. Where X is the position of the exciting element 10 on the inductive ruler 20, S is the number of periods of the analyzed band (e.g., 0, 0.5, 1, 1.5, . . . ), $T_L$ is the distance of the periods of the analyzed band, $X_0$ is the distance from the inductive voltage of the Sth period to X, $V_t$ is the value of the process voltage, $V_0$ is the linear initial voltage value of the Sth period, and m is the slope value of $(X, V_t)$. There are many other position conversion algorithms, and this disclosure is not limited to the above-mentioned.

In the second embodiment of the method (i.e., the double-sided pattern ruler shown in FIG. 6A), in step S82 a position conversion algorithm, $X=S\times\frac{1}{2}(T_L)+X_0=S\times\frac{1}{2}(T_L)+(V_t-V_0)/m$, is provided to calculate the position (X) of the exciting element 10 on the inductive ruler 20 directly from the position sensing waveform. Where X is the position of the exciting element 10 on the inductive ruler 20, S is the number of periods of the analyzed band (e.g., 0, 0.5, 1, 1.5, . . . ), $T_L$ is the distance of the periods of the analyzed band, $X_0$ is the distance from $S\times\frac{1}{2}(T_L)$ to X, $V_t$ is the value of the process voltage, $V_0$ is the linear initial voltage value of the Sth period, and m is the slope value of $(X, V_t)$. There are many other position conversion algorithms, and this disclosure is not limited to the above-mentioned.

It is know from the above that according to this disclosure, the inductive voltage is generated when a position of the pattern of the inductive ruler changes within the alternating magnetic field of the exciting element. Then the position can be resolved based on the inductive voltage value. Therefore, the position detection precision and stability are improved. And a metal wire pattern formed by transfer-printing process can be scaled up easily. The problems of time-consuming for magnetization, the magnetic pole pattern detection, voltage phase shift resolution, installation accuracy, and less prone to be scaled up are solved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A magnetic position detecting device, comprising:
   an exciting element configured for generating an alternating magnetic field;
   an inductive ruler with a first pattern and configured for generating an inductive voltage based on a position change between the pattern and the exciting element; and
   a position resolving element configured for capturing the inductive voltage and resolving a position of the exciting element on the inductive ruler based on the inductive voltage,
   wherein the position resolving element sequentially comprises an inductive voltage signal processing unit, an analog digital converter, and an inductive voltage position resolving unit,
   wherein the inductive voltage signal processing unit sequentially comprises a first amplifier, a low-pass filter, an envelope detector, a level shifter, and a second amplifier,
   wherein the first amplifier is sequentially connected to the low-pass filter, the envelope detector, the level shifter, the second amplifier, the analog digital converter, and the inductive voltage position resolving unit,
   wherein the position of the exciting element on the inductive ruler is obtained by either equations 1) $X=S\times T_L+X_0=S\times T_L+(V_t-V_0)/m$ or 2) $X=S\times\frac{1}{2}(T_L)+X_0=S\times\frac{1}{2}(T_L)+(V_t-V_0)/m$, and
   wherein X is the position of the exciting element on the inductive ruler, S is a number of periods of an analyzed band, $T_L$ is a distance of the periods of the analyzed band, $X_0$ is a distance from a process voltage of a Sth period to X, $V_t$ is a value of the process voltage, $V_0$ is a linear initial voltage value of the Sth period, and m is a slope value of $(X, V_t)$.

2. The magnetic position detecting device of claim 1, wherein the pattern on the inductive ruler is constituted by a metal wire.

3. The magnetic position detecting device of claim 1, further comprising an AC power supply unit configured for applying AC power to the exciting element to generate the alternating magnetic field.

4. The magnetic position detecting device of claim 3, wherein:
   the inductive voltage signal processing unit is configured for reading the inductive voltage, and filtering and wave detecting the inductive voltage to obtain the process voltage, wherein the filtering is to filter out carrier frequencies of the AC power contained in the inductive voltage; and
   the inductive voltage position resolving unit is configured for resolving the position of the exciting element on the inductive ruler based on a relation that a length of an X coordinate corresponding to a period of the process voltage is equal to a distance of an X coordinate corresponding to a period of the pattern on the inductive ruler.

5. The magnetic position detecting device of claim 4, where for equation 1), the pattern is located on a front side or a rear side of the inductive ruler and is a square wave, the inductive voltage signal processing unit processes the inductive voltage to obtain the process voltage showing a quasi-triangular wave, and the inductive voltage position resolving unit captures all bands of the process voltage to obtain the analyzed band and resolves the position from the analyzed band based on the relation that the length of the X coordinate corresponding to the period of the process voltage is equal to the distance of the X coordinate corresponding to the period of the pattern on the inductive ruler.

6. The magnetic position detecting device of claim 4, where for equation 2), the inductive ruler has two patterns that are square waves and differ from each other by a ½ pitch distance or a ¼ period, and the inductive voltage signal processing unit processes the inductive voltage to obtain two process voltages showing two quasi-triangular waves, the two patterns are on the front and rear sides of the inductive ruler, respectively, and wherein the inductive voltage signal processing unit captures non-turning curve bands of said two process voltages showing said two quasi-triangular waves to obtain the analyzed band, the analyzed band having upward and downward triangular waves, and the inductive voltage signal processing unit resolves the position of the exciting element on the inductive ruler from the analyzed band based on the relation that the length of the X coordinate corresponding to the period of the process voltage is equal to the distance of the X coordinate corresponding to the period of the pattern on the inductive ruler, the two patterns including the first pattern.

7. The magnetic position detecting device of claim 4, wherein the inductive voltage signal processing unit filters and wave detects the inductive voltage that has an amplitude variation to obtain the process voltage without the carrier frequencies, and a voltage variation of the process voltage corresponds to a moving distance variation of the exciting element on the inductive ruler.

8. The magnetic position detecting device of claim 1, wherein the exciting element further comprises a first magnetic pole part, a second magnetic pole part and an opening disposed between the first magnetic pole part and the second magnetic pole part, allowing the pattern to move in the opening through the first magnetic pole part and the second magnetic pole part.

9. A method for detecting a magnetic position, comprising:
   providing an inductive ruler with a first pattern;
   generating an alternating magnetic field by an exciting element;
   generating an inductive voltage based on a position change between the pattern on the inductive ruler and the exciting element; and
   capturing, by a position resolving element, the inductive voltage, and resolving a position of the exciting element on the inductive ruler based on the inductive voltage,
   wherein the position resolving element sequentially comprises an inductive voltage signal processing unit, an analog digital converter, and an inductive voltage position resolving unit,
   wherein the inductive voltage signal processing unit sequentially comprises a first amplifier, a low-pass filter, an envelope detector, a level shifter, and a second amplifier,
   wherein the first amplifier is sequentially connected to the low-pass filter, the envelope detector, the level shifter, the second amplifier, the analog digital converter, and the inductive voltage position resolving unit
   wherein the position of the exciting element on the inductive ruler is obtained by either equations 1) $X = S \times T_L + X_0 = S \times T_L + (V_t - V_0)/m$ or 2) $X = S \times \frac{1}{2}(T_L) + X_0 = S \times \frac{1}{2}(T_L) + (V_t - V_0)/m$, and
   wherein X is the position of the exciting element on the inductive ruler, S is a number of periods of an analyzed band, $T_L$ is a distance of the periods of the analyzed band, $X_0$ is a distance from a process voltage of a Sth period to X, $V_t$ is a value of the process voltage, $V_0$ is a linear initial voltage value of the Sth period, and m is a slope value of $(X, V_t)$.

10. The method of claim 9, wherein the alternating magnetic field is generated by an AC power supply unit supplying AC power to the exciting element.

11. The method of claim 10, wherein the step that the position resolving element resolves the position of the exciting element on the inductive ruler further comprises:
   enabling the inductive voltage signal processing unit to read from the inductive ruler the inductive voltage that is generated based on the position change between the pattern on the inductive ruler and the exciting element, and filtering and wave detecting the inductive voltage to obtain the process voltage, wherein the filtering is to filter out carrier frequencies of the AC power contained in the inductive voltage; and
   enabling the inductive voltage position resolving unit to resolve the position of the exciting element on the inductive ruler based on a relation that a length of an X coordinate corresponding to a period of the process voltage is equal to a distance of an X coordinate corresponding to a period of the pattern on the inductive ruler.

12. The method of claim 11, where for equation 1), the pattern is formed on a front side or a rear side of the inductive ruler and is a square wave, the inductive voltage signal processing unit processes the inductive voltage to obtain the process voltage that is in the form of a triangular wave, and the inductive voltage position resolving unit captures all bands of the process voltage to obtain the analyzed band, and resolves the position of the exciting element on the inductive ruler from the analyzed band based on the relation that the length of the X coordinate corresponding to the period of the process voltage is equal to the distance of the X coordinate corresponding to the period of the pattern on the inductive ruler.

13. The method of claim 11, where for equation 2), the inductive ruler has two patterns that are square waves and differ from each other by a ½ pitch distance or a ¼ period, and the inductive voltage signal processing unit processes the inductive voltage to obtain two process voltages showing two quasi-triangular waves, the two patterns are on the front and rear sides of the inductive ruler, respectively, the inductive voltage signal processing unit captures non-turning curve bands of said two process voltages showing said two quasi-triangular waves to obtain the analyzed band, the analyzed band having upward and downward triangular waves, and the inductive voltage signal processing unit resolves the position of the exciting element on the inductive ruler from the analyzed band based on the relation that the length of the X coordinate corresponding to the period of the process voltage is equal to the distance of the X coordinate corresponding to the period of the pattern on the inductive ruler, the two patterns including the first patterns including the first pattern.

14. The method of claim 11, wherein the inductive voltage signal processing unit filters and wave detects the inductive voltage that has an amplitude variation to obtain the process voltage without the carrier frequencies, and a voltage variation of the process voltage corresponds to a moving distance variation of the exciting element on the inductive ruler.

* * * * *